United States Patent [19]
Bellaar

[11] Patent Number: 5,861,666
[45] Date of Patent: Jan. 19, 1999

[54] STACKED CHIP ASSEMBLY

[75] Inventor: Pieter H. Bellaar, Baambrugge, Netherlands

[73] Assignee: Tessera, Inc., San Jose, Calif.

[21] Appl. No.: 705,309

[22] Filed: Aug. 29, 1996

Related U.S. Application Data

[60] Provisional application No. 60/003,035 Aug. 30, 1995.
[51] Int. Cl.[6] ............................ H01L 23/02; H01L 23/48; H01L 23/34
[52] U.S. Cl. ............................ 257/686; 257/777; 257/723; 257/779; 257/785
[58] Field of Search ................................ 257/686, 777, 257/723, 779, 780, 785

[56] References Cited

U.S. PATENT DOCUMENTS

| | | | |
|---|---|---|---|
| 3,214,827 | 11/1965 | Phohofsky | 29/155.5 |
| 3,775,844 | 12/1973 | Parks | 29/830 |
| 4,225,900 | 9/1980 | Ciccio et al. | 361/739 |
| 4,941,033 | 7/1990 | Kishida | 257/777 |
| 4,982,265 | 1/1991 | Watanabe et al. | 257/686 |
| 5,046,238 | 9/1991 | Daigle et al. | 29/830 |
| 5,138,438 | 8/1992 | Masayuki et al. | 257/686 |
| 5,148,265 | 9/1992 | Khandros et al. | 257/773 |
| 5,148,266 | 9/1992 | Khandros et al. | 257/773 |
| 5,172,303 | 12/1992 | Bernardoni et al. | 361/744 |
| 5,198,888 | 3/1993 | Sugano et al. | 257/686 |
| 5,222,014 | 6/1993 | Lin | 361/729 |
| 5,247,423 | 9/1993 | Lin et al. | 361/719 |
| 5,281,852 | 1/1994 | Normington | 257/685 |
| 5,334,875 | 8/1994 | Sugano et al. | 361/719 |
| 5,347,159 | 9/1994 | Khandros et al. | 257/692 |
| 5,390,844 | 2/1995 | DiStefano et al. | 228/180.21 |
| 5,397,916 | 3/1995 | Normington | 257/686 |
| 5,398,863 | 3/1995 | Grube et al. | 228/106 |
| 5,422,435 | 6/1995 | Takiar et al. | 174/52.4 |
| 5,426,563 | 6/1995 | Moresco et al. | 361/689 |
| 5,440,171 | 8/1995 | Miyano et al. | 257/700 |
| 5,454,160 | 10/1995 | Nickel | 29/840 |
| 5,455,740 | 10/1995 | Burns | 361/735 |
| 5,479,319 | 12/1995 | Burns | 361/735 |
| 5,489,749 | 2/1996 | DiStefano et al. | 174/261 |
| 5,491,302 | 2/1996 | DiStefano et al. | 114/260 |
| 5,543,664 | 8/1996 | Burns | 257/787 |
| 5,656,856 | 8/1997 | Kweon | 257/686 |

FOREIGN PATENT DOCUMENTS

| | | |
|---|---|---|
| 0 080 041 A3 | 6/1983 | European Pat. Off. . |
| 2 312 172 | 4/1976 | France . |
| 4-303969 | 10/1992 | Japan ........... 257/686 |
| WO 94/03036 | 2/1994 | WIPO . |

OTHER PUBLICATIONS

Daryl Ann Doane and Paul D. Franzon, "Packaging Performance Factors," Multichip Module Technologies and Alternatives: The basics, pp. 109–112, ©1993 by Van Nostrand Reinhold.

N. Senba et al., "Application of 3–Dimensional Memory Module," ISHM 1996 Proceedings, pp. 279–284.

*Primary Examiner*—Teresa M. Arroyo
*Attorney, Agent, or Firm*—Lerner, David, Littenberg, Krumholz & Mentlik

[57] ABSTRACT

An assembly of semiconductor chips has the chips vertically stacked above one another. Interposers extending between adjacent chips have compliant layers to accommodate thermal expansion of the chips. Desirably, the interposers have metallic plates to conduct heat from the interior of the stack.

25 Claims, 3 Drawing Sheets

STACKED CHIP ASSEMBLY

CROSS REFERENCE TO RELATED APPLICATIONS

The present application claims benefit of U.S. Provisional Application No. 60/003,035, filed Aug. 30, 1995.

BACKGROUND OF THE INVENTION

The present invention relates to semiconductor chip assemblies, and more particularly relates to semiconductor chip assemblies in which a plurality of chips are stacked one atop the other.

Semiconductor chips are commonly provided as individual, prepackaged units. Thus, the semiconductor chip itself typically is mounted to a substrate or chip carrier, which in turn is mounted on a circuit panel such as a printed circuit board. Considerable effort has been devoted towards development of so-called "multichip modules" in which several chips having related functions are attached to a common circuit panel and protected by a common package. This approach conserves some of the space which is ordinarily wasted by individual chip packages. However, most multichip module designs utilize a single layer of chips positioned side by side on a surface of a planar circuit panel. A typical chip is in the form of a flat, rectangular body with a large front face having contacts for connection to the internal circuitry of the chip. Each chip is mounted on the circuit panel with the front face or the rear face facing towards the panel. The so-called "flip chip" arrangement, in which the front face of the chip confronts the face of the circuit panel and the contacts on the chip are bonded to the circuit panel by solder balls or other interconnections provides a relatively compact arrangement; each chip occupies an area of the circuit panel equal to or slightly larger than the area of the chip front face. As disclosed, for example, in U.S. Pat. Nos. 5,148,265 and 5,148,266, assigned to the present assignee as the present application, certain innovative mounting techniques offer compactness approaching or equaling that of conventional flip chip bonding without the reliability and testing problems commonly encountered in that approach. When other mounting arrangements, such as tape automated bonding (TAB) or wire bonding are used, the area of the circuit panel required to mount each chip is substantially larger than the area of the chip front face. However, when only a single layer of chips is mounted on a circuit panel, using any of these approaches, the circuit panel has an area at least equal to the aggregate areas of the individual chips. This implies that the leads interconnecting the various chips in the assembly have substantial length. This in turn implies appreciable delay in transmission of signals between chips and hence limits the speed of operation of the assembly.

Various proposals have been advanced for packaging chips in a "stacked" arrangement one atop the other, in front face to rear face orientation. For example, certain embodiments of the invention disclosed in commonly assigned U.S. Pat. No. 5,347,159 allow stacking of chips one atop the other. Also, Kishida, U.S. Pat. No. 4,941,033 discloses an arrangement in which chips are stacked one atop the other and interconnected with one another by conductors on so-called "wiring films" associated with the chips. However, still further improvements in stacked chip assemblies and in components useful for making the same would be desirable. In particular, there are needs for chip assemblies which can be assembled readily using available techniques. There are further needs for such chip assemblies which can provide electrical conductive pathways connecting the chips to one another and to external circuit elements with low impedance and short circuit path lengths.

The stacked chip assemblies should deal effectively with the problems associated with heat generation in stacked chips. Chips dissipate electrical power as heat during operation. Where chips are stacked one atop the other, it is difficult to dissipate the heat generated by the chips in the middle of the stack. Consequently, the chips in such a stack may undergo substantial thermal expansion when operated and substantial contraction when operation ceases. This, in turn, imposes significant mechanical stress on the interconnecting arrangements and on the mountings which physically retain the chips. Stacked chip assemblies should be capable of withstanding thermal expansion and a contraction of the chips. Moreover, there has been a need for chip assemblies which provide enhanced heat dissipation, particularly from chips in the middle of a stack.

SUMMARY OF THE INVENTION

The foregoing invention addresses these needs.

One aspect of the present invention provides a multiple semiconductor chip assembly. Preferred assemblies in accordance with this aspect of the present invention include a plurality of chip and interposer subassemblies. Each such subassembly includes an interposer and a semiconductor chip having front and rear faces mounted to the interposer. One of these faces of the chip faces the interposer. Each interposer includes at least one peripheral portion projecting laterally beyond the edges of the chip which is mounted to that interposer. Each interposer also includes a plurality of leads electrically connected to the chip and extending to the peripheral portion or portions. More preferably, in accordance with this aspect of the invention, the assembly further includes compliant layers disposed between the chips and interposers so as to permit relative movement of the chips and interposers to compensate for thermal expansion and contraction of the components. The subassemblies are stacked one atop the other so that the chips overlie one another and so that the projecting portions of the interposers overlie one another. The assembly further includes a plurality of vertical conductors extending alongside the chips and interconnecting the leads of the various interposers at the peripheral portions.

The vertical conductors may be substantially rigid conductors as, for example, conductors formed from metallic masses such as solid core solder balls or metallic masses disposed alongside the chips. Alternatively or additionally, the vertical conductors can include metallic rods extending through a plurality of the interposers and bonded to the leads at each interposer. Typically, each interposer includes a dielectric layer which may be a flexible film or a rigid layer. The leads of each interposer desirably extend along a surface of the dielectric layer.

Each lead most preferably includes a flexible inner end connected to the chip and an outer end extending into the peripheral portion of the interposer. Most preferably, the outer end has a cross sectional area substantially larger than the cross-sectional area of the inner end. Thus, the outer ends of the leads can be thick, broad conductors which aid in conduction of heat from between adjacent chips. Also, the interposers may include metallic plates. Each such plate may extend from a central region of the interposer aligned with the chip to a peripheral region of the interposer. Thus, the plates act as additional heat conduction elements. For example, each interposer may be of a generally rectangular shape and may have peripheral portions extending outwardly from the edges of the chip at four edges. The leads may extend outwardly along two opposite edges of the interposer, whereas the plate may extend along the other two edges. The outer ends of the leads and the plate preferably occupy most of the perimeter of the interposer, and typically about 75% or more of the perimeter. The spaces between adjacent leads, and between the leads and the plate may be as small as required to maintain electrical insulation between the leads.

The assembly may further include a heat conductive element such as a metallic thermal sink or spreader in thermal communication with the stack. In a particularly preferred arrangement, the metallic sink or spreader includes a metallic enclosure encompassing the stack. Faces of the metallic enclosure may be juxtaposed with the projecting portions of the plates, with the outer ends of the leads, or both so that the plates, the leads or both provide a low resistance thermal path to the enclosure. An electrically insulating but thermally conductive material desirably fills the enclosure and occupies any otherwise empty spaces.

The assembly desirably further includes a circuit panel or panels connected to the top end, the bottom end or both of the vertical conductors. In a particularly preferred arrangement, the circuit panel itself has front and rear faces. One face of the circuit panel is connected to the stacked chips, whereas the opposite face may be connected to another chip, or to another stack of chips and these elements may be interconnected vertically through the circuit panel by conductors therein. For example, the stacked chips may include memory chips and a processor may be connected to the opposite side of the circuit panel from the stacked memory chips. This provides a particularly short path length and particularly rapid access by the processor to data stored in the memory chips.

Each of the subassemblies may be tested before assembly with the others to form the stack. Further aspects of the present invention provides methods of making a stacked assembly. In these methods, the stack can be assembled by reflowing a bonding material such as solder or a conductive adhesive to bond metal masses on each subassembly to leads of the adjacent subassembly, thereby forming the vertical conductors.

These and other objects, features, and advantages of the present invention will be more readily apparent from the description of the preferred embodiments set forth below, taken in conjunction with the accompanying drawings.

DETAILED DESCRIPTION OF THE PREFERRED EMBODIMENTS

Figures 1, 2:
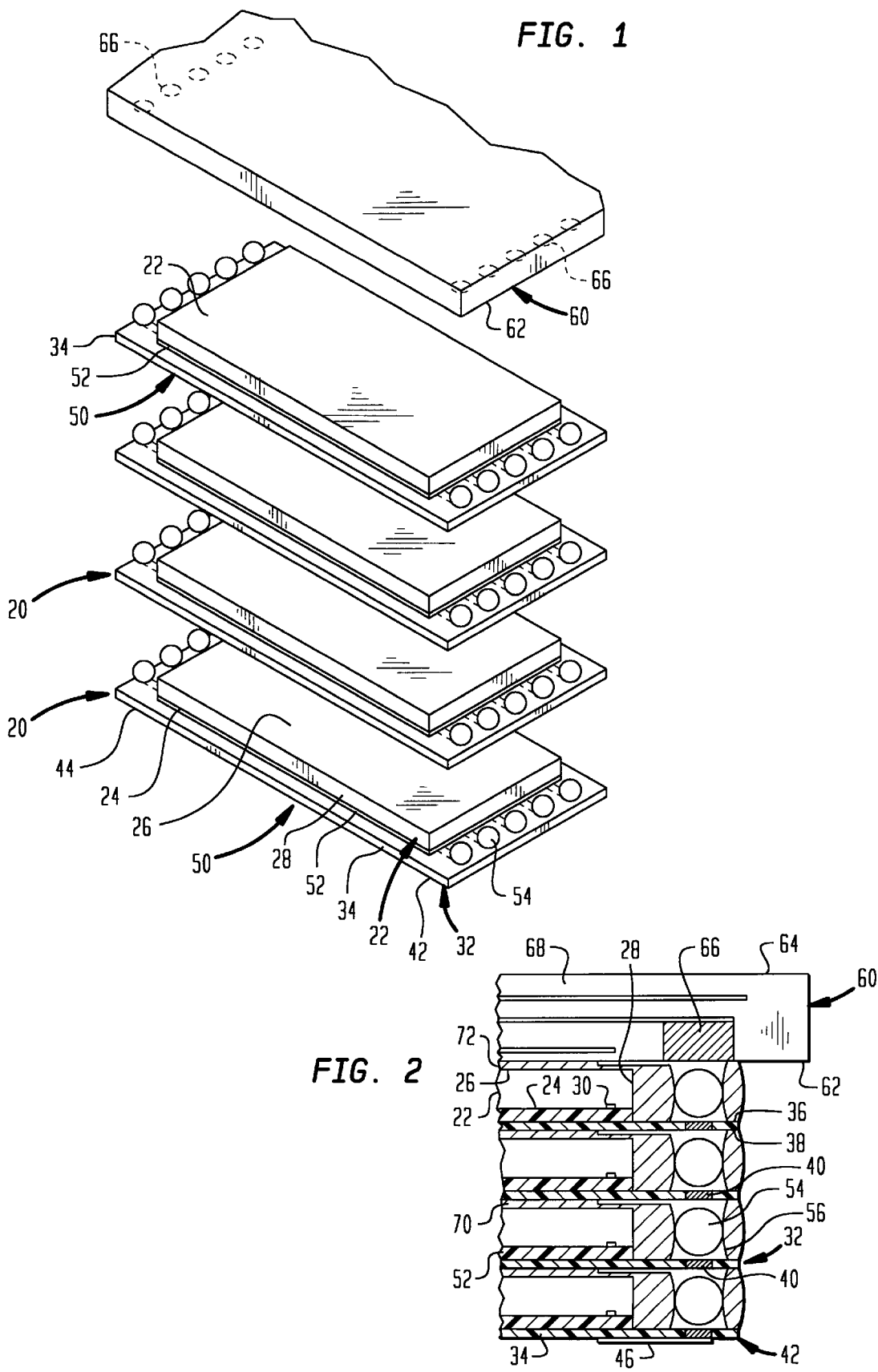
FIG. 1 is a diagrammatic exploded view of a chip assembly in accordance with one embodiment of the invention.
FIG. 2 is a fragmentary, diagrammatic sectional view of the chip assembly depicted in FIG. 1.

As shown in FIG. 1, an assembly in accordance with one embodiment of the invention includes a plurality of chip and substrate subassemblies 20. Each subassembly includes a semiconductor memory chip 22. Each semiconductor chip is generally in the form of a rectangular solid having a front face 24 and an oppositely directed rear face 26, with edges 28 extending between the front and rear faces. The chips have contacts 30 on front face 24 connected to the internal electronic components (not shown). The contacts are arranged in two rows adjacent to opposite edges 28 of each chip. In the assembly illustrated, the various chips are identical to one another in physical configuration and in internal structure.

Each subassembly 20 further includes an interposer 32. Each interposer 32 includes a generally planar dielectric layer 34 having a first surface 36 and a second, opposite surface 38. Each interposer further includes metallic vias 40 extending through dielectric layer 34 from surface 36 to surface 38 in a peripheral region 42 of the interposer, adjacent one edge of dielectric layer 34. Each interposer has similar vias (not shown) in a further peripheral portion 44 adjacent the opposite edge of the dielectric layer. Metallic leads 46 (FIG. 2) extend along the second surface 38 of each dielectric layer from a central region 50 of the interposer to the peripheral regions 42 and 44. Each lead 46 is electrically connected to one of the vias 40 in a peripheral region of the interposer.

The chip 22 of each subassembly is mounted on the central region 50 of the interposer, with the front or contact-bearing face 24 of the chip facing towards the first side 36 of the dielectric layer 34. The contacts 30 of each chip are connected to the leads 46 of the dielectric layer so that each contact 30 is connected to one lead and one via 40. Although not shown in FIGS. 1 and 2, the electrical connections between the contacts 30 and the leads 46 may include flexible portions of leads 46 as discussed below in connection with FIGS. 3–5. A layer of a compliant material such as a gel or an elastomer 52 is disposed between the front face 24 of each chip and the surface 36 of dielectric layer 34. Thus the dielectric layer of each subassembly is mechanically decoupled from the chip and free to deform and deflect independently of the chip. Vias 40 can move relative to contacts 30 on the chip without damage to the electrical interconnection formed from copper or a copper alloy.

Each subassembly further includes metallic balls 54, preferably bonded to vias 40 on the first surface 36 of the dielectric layer by solder 56. As best seen in FIG. 2, the diameter of each ball 54 is approximately equal to the combined thickness of compliant layer 52 and chip 22. The balls are arranged in rows along the peripheral regions 42 and 44 so that the balls are disposed alongside the chips. Balls 54 may be provided as conventional "solid core solder balls." Thus, the balls initially have coatings of solder which is reflowed to bond the balls to vias 40.

The assembly further includes a circuit panel 60 having a first side 62, a second side 64, and metallic contact pads 66 disposed in rows on the first side 62 of the panel. Panel 60 further has electrical conductors 68, some of which extend to contact pads 66. Conductors 68 are arranged in the conventional manner to provide interconnections with additional circuit elements (not shown).

In an assembly process according to one embodiment of the invention, the individual subassemblies as described above are fabricated. Each subassembly can be tested separately by engaging the vias 40 with contacts of a test socket, or by engaging the balls 54 in a socket. The chip, leads and connections can then be tested by actual operation of the chip. After testing, the individual subassemblies are stacked one atop the other as shown in the drawings, so that the chips 22 of all of the subassemblies overlie one another in front face to rear face disposition, and so that the peripheral portions 42 and 44 of the various interposers are aligned with one another. In this arrangement, the vias 40 on the various interposers and the balls 54 associated therewith are also aligned with one another. Thus, the ball 54 associated with each via 40 on one interposer makes contact with the corresponding via 40 on the next interposer in the stack. The stacked subassemblies are aligned with circuit panel 60 so that contact pads 66 are aligned with the stacked balls and vias. While the components are held together in this arrangement, heat is applied so as to reflow solder 56, thereby fusing the aligned balls and vias of all of the subassemblies into continuous electrical conductors. Each includes a single conductor ball and via of each subassembly. Each such conductor extends vertically through the entire stack and is fused to one contact pad 66 of the circuit panel.

After fusion, a liquid dielectric encapsulant is applied on the assembly. The encapsulant forms a compliant protective layer 70 between the back surface 26 of each chip and the next adjacent interposer and also forms a layer 72 between the back surface 26 of the end chip in the stack and the first surface 62 of the circuit panel. The encapsulant also encloses the vertical conductors formed by the metal balls 54.

In operation, signals and power can be routed to and from the chips through the vertical conductors and through the attached contact pads 66 of the circuit panels. All of the chips are located in an area on the surface of the circuit panel 60 only slightly larger than the surface area of a single chip. This provides extraordinarily short circuit path lengths. The vertical dimensions of the assembly have been greatly exaggerated in FIG. 2 for clarity of illustration. In fact, each chip is typically quite thin. In a typical assembly using four 16 megabit memory chips stacked atop one another to provide 64 megabits (8 megabytes) of memory, the entire assembly is only 1.2 mm high, 13 mm wide, and 14 mm long. Thus, each vertical conductor is less than 1.2 mm long. The electrical path from any contact pad 66 to any contact 30 on a chip is less than about 1.2 mm long. Moreover, the vertical conductors have low capacitance with low parasitic impedance.

In operation, the chips tend to generate heat, which in turn causes thermal expansion of the chips. However, the chips can expand and contract freely without damaging the electrical connections and without applying substantial mechanical loads to the vertical conductors, to the solder joints within the vertical conductors or to the solder joints between the vertical conductors and the contact pads on the circuit panel. Because each chip is mechanically decoupled from the associated interposer, and from the other interposers and chips in the stack, the various components can deform, move and bend as required to compensate for thermal expansion and contraction without damaging the assembly. The dielectric layers of the interposers may also be flexible.

Figure 3:
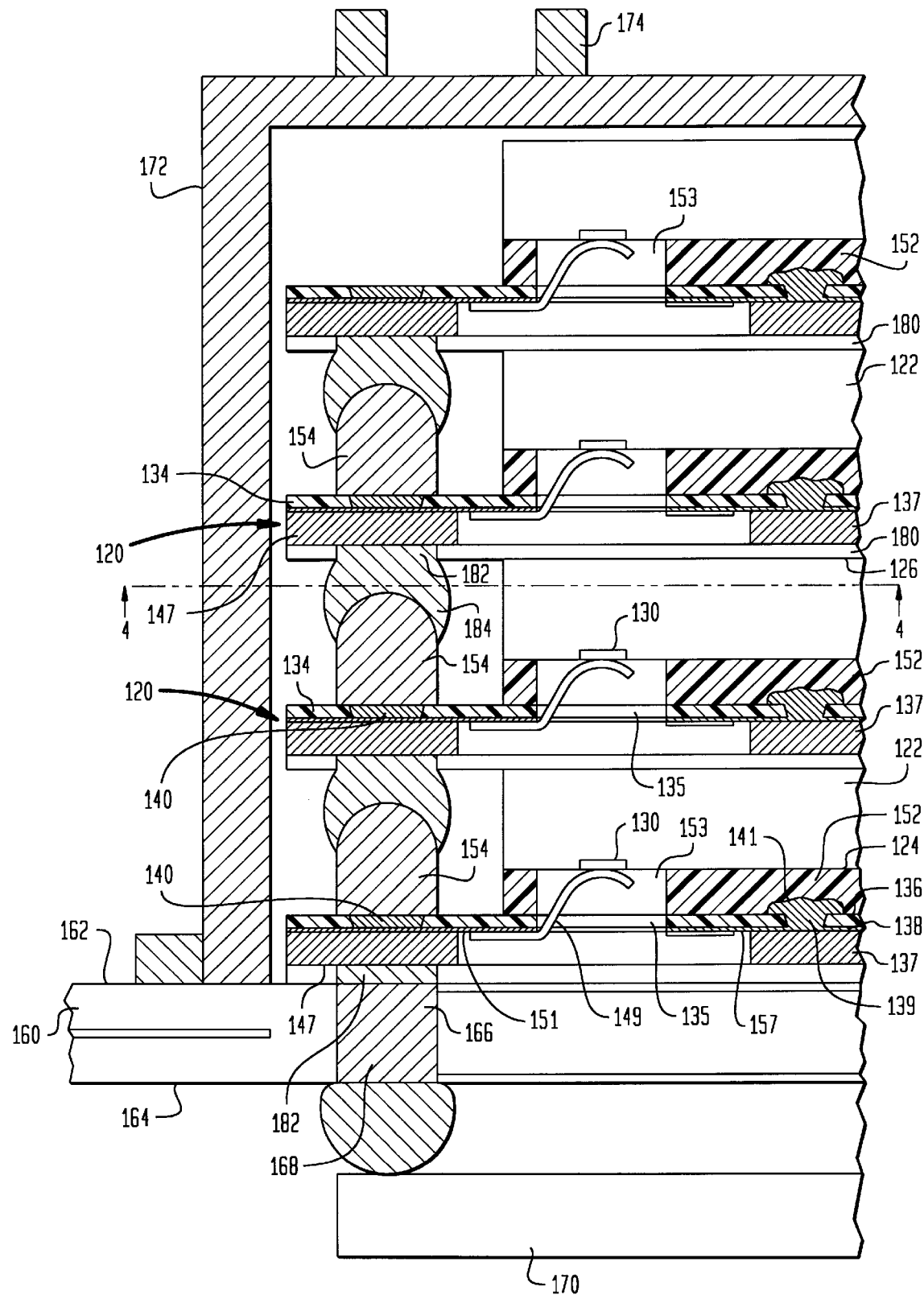
FIG. 3 is a diagrammatic sectional view of a chip assembly in accordance with a further embodiment of the invention.
Figure 4:
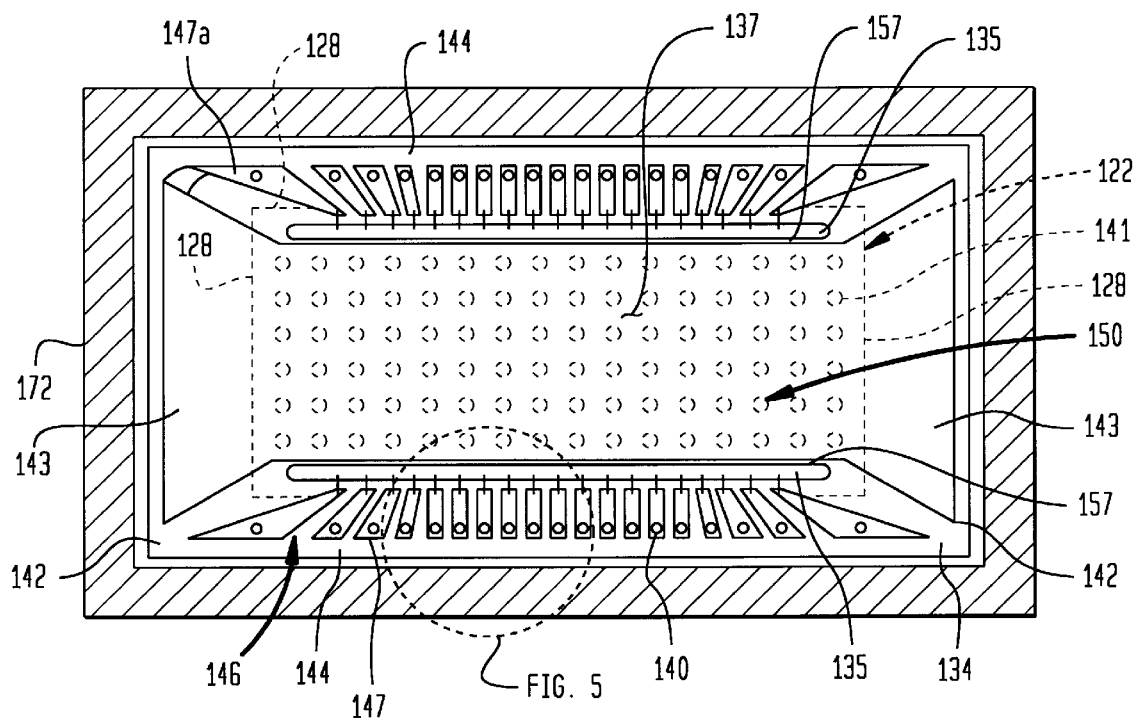
FIG. 4 is a sectional view taken along line 4—4 in FIG. 3.
Figure 5:
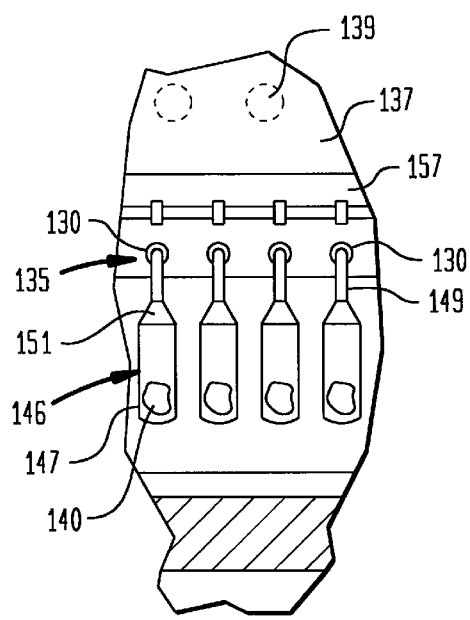
FIG. 5 is a fragmentary view on a large scale depicting a portion of the assembly shown in FIGS. 3 and 4.

As depicted in FIGS. 3–5, an assembly in accordance with a further embodiment of the invention includes subassemblies 120 each including a chip 122 similar to the chips discussed above. Each chip includes contacts 130 disposed in rows along two opposite edges. Each subassembly further includes an interposer incorporating a dielectric layer 134. Each layer 134 is in the form of a generally rectangular sheet with a pair of slots 135 extending through the layer adjacent to two long edges of the layer. In this assembly as well, each chip is mounted to the dielectric layer with the front or contact bearing surface 124 of the chip facing towards the first surface 136 of the dielectric layer. The contacts 130 on each chip are arranged in rows, and these rows of contacts are aligned with the slots 135 in the dielectric layer. A layer of a compliant material such as a gel or elastomer, preferably at least about 40 microns thick, more preferably between about 50 and about 100 microns thick and most preferably about 75 microns thick is disposed between the front face 124 of each chip and the first surface 136 of the corresponding dielectric layer. Each compliant layer 152 has slots 153 aligned with the slots 135 in the dielectric layer and with the contacts 130 of the chip.

Each interposer further includes a metallic plate 137 overlying the second surface 138 of the dielectric layer in the central region 150 (FIG. 4) of the interposer, i.e., in the region of the interposer aligned with the chip. The dielectric layer has apertures 139 in its central region. Thermally conductive metallic via liners 141 contiguous with plate 137 extend through these apertures, to the first side 136 of the dielectric layer. Plate 137 has a pair of tabs 143 projecting outwardly, away from the central region 150 of the interposer and extending into peripheral regions 142 at opposite ends of the interposer. Thus, the tabs 143 project outwardly beyond the edges 128 of the chip 122.

Each interposer further includes vias 140. As best appreciated with reference to FIG. 4, the peripheral regions 144 and hence the rows of vias 140 are disposed along two opposite edges of the interposer between the other opposed edges 142 occupied by tabs 143. Each interposer further includes a set of leads 146 extending outwardly from slots 135 to regions 144 of the interposer. Each lead 146 includes a thick outer end 147 having a relatively large cross-sectional area and a thin, flexible inner end 149 extending through slot 135 of the dielectric layer and bonded to the contact 130 of the chip. Preferably, the outer ends 147 of the leads have thickness substantially equal to the thickness of plate 137 and tabs 143. These elements may be, for example, more than 25 microns thick and desirably between about 35 microns and about 50 microns thick. The plate 137 and lead outer ends 147 desirably are formed from copper, copper alloys or other metals such as gold or silver having high thermal conductivity. The flexible inner end 149 of each lead may be joined to the outer end by a flat, thin tab 151, preferably about 10 microns thick or less. Each flexible section 149 may be formed from in whole or in part from a flexible, fatigue resistant and electrically conductive metal such as gold, gold alloy, silver or other alloy. Each interposer also has a set of metallic masses 154 protruding upwardly from each via 140 at the first surface of the interposer.

Each interposer may be formed from a sheet of the dielectric material which initially has a thin layer of copper or other metal on its entire second surface 138. The flexible inner ends 149 of the leads may be formed by depositing short strips of the conductive metal so that each such short strip extends on the thin metal layer and bridges across the area which will later form the slot 135. Holes are formed through the dielectric layer at the locations to form vias 14 at apertures 139. Vias 140 are then filled with metal and masses 154 are formed by additively plating copper onto the first surface. At the same time, metallic via liners 141 are formed in each aperture 139. The thin copper layer on second surface 138 is masked so that only the areas corresponding to plate 137, tabs 143 and the outer ends of the leads are exposed. Using an additive process, copper is applied to form plate 137 and to form the outer ends 147 of the leads. At this stage of the process, the entire second surface of the dielectric layer is covered by a continuous copper layer and hence all of the regions to be plated are readily connected to the plating current. Following this stage, the masking is removed except at tabs 151 and at edges 157 between plate 137 and each slot 135. The second side of the dielectric layer is then exposed to an etchant which removes the thin copper layer except at the tabs 151 and at edge 157. The masking is then removed. Slots 135 are then formed, as by etching or ablating the dielectric layer.

At this stage, each lead inner end 149 bridges across the slot. The compliant layer 152 is positioned on the first surface, with slots 153 aligned with the slots 135 in the dielectric layer. The chip is assembled to the compliant layer. The inner end 149 of each lead is broken away from edge 157 and bent into slots 135 and 153 to engage the appropriate contact 130 on the chip. The lead is then bonded to the contact as by sonic or thermosonic bonding. To facilitate this process, the inner end of each lead may be formed with a frangible section (not shown) at or adjacent the juncture of the lead with edge 157. The lead structures and lead bonding processes may be as described in commonly assigned PCT International Publication WO 94/03036 and/or in U.S. Pat. Nos. 5,489,749; 5,398,863; 5,390,844; and 5,491,302, the disclosures of which are hereby incorporated by reference herein. The plate 137 of each subassembly may be electrically connected to a power or ground connection of the chip incorporated in such subassembly. To provide such connection, one of the lead outer ends 147a may be formed integrally with the tab 143 of the plate.

Subassemblies 120 are stacked one atop the other substantially in the manner described above. Thus, peripheral regions 144 bearing the outer ends of leads 147 and vias 140 are aligned with one another, so that each metal mass 154 is aligned with the outer end 147 of the corresponding lead on the next higher circuit panel. Layers 180 of a dielectric, heat conductive adhesive are disposed between each interposer and the next lower chip, so that each layer 180 extends between the rear surface 126 of a chip and the plate 137 of the next higher interposer. Layers 180 are provided with apertures 182 in locations corresponding to the locations of vias 140 and masses 154. Masses of solder 184 are provided on the bottom surface of each lead outer end 147 in alignment with the aperture 182 and with the metal mass 154 of the next lower interposer. The stacked elements are disposed on a surface 162 of a circuit panel 160, so that the lead outer ends 147 and apertures 182 of the end subassembly are aligned with contact pads 166 on the surface of the circuit panel. Solder masses are provided at the contact pads 166 as well. The assembly is bonded together in a single operation by applying heat and pressure so as to reflow each of solder masses 184 and by fuse the solder masses 184, copper masses 154, lead outer ends 147, and vias 140 into continuous vertical conductors. Here again, each vertical conductor interconnects one lead on each interposer with a contact pad 166 on the circuit panel. Circuit panel 160 has vertical through conductors 168, which one is visible in FIG. 3. A chip 170 is mounted to through conductors 168 on the second side 164 of the circuit panel so that each terminal of chip 170 is directly connected to a vertical conductor of the stacked chips and interposers. This provides a particularly short path length between chip 170 and the other chips 122 of the assembly. For example, chip 170 may be a processor chip and the chips 122 incorporated in the assembly may be memory chips.

The assembly further includes a metallic shell 172 surrounding the stacked assemblies. Shell 172 is provided with fins, schematically indicated at 174 for dissipation of heat. The space within the shell surrounding the other components is filled with a compliant material such as a gel or an elastomer, or with a liquid material. The filling material adds in conduction of the heat within the assembly. As best appreciated with reference to FIG. 4, tabs 143 of the plates project outwardly beyond the edges of the stacked chips into close proximity with shell 172 and thus provide an efficient path for conduction of heat from the center of the stack to the shell. Additionally, the thick, highly conductive outer portions 147 of the leads extend into proximity with the shell and aid in conduction of heat from the vicinity of the chip to the shell. For example, the edges of the chips may be spaced about 300–350 microns from the inside of shell 172, whereas the outer ends of 147 of the leads and tabs 143 may extend to within about 50 microns or less and preferably to within about 25 microns of the shell. Also, the end chip 122 at the end of the stack remote from circuit panel 160 may be directly bonded to the overlying surface of shell 172. As also shown in FIG. 4, most of the perimeter of the interposer is occupied by the thick tabs 143 and the thick outer ends 147 of the leads. Thus, heat is effectively conducted from the vicinity of each chip to the shell. Desirably, the lead outer ends and the tabs cooperatively occupy at least about 50 percent, and most preferably at least about 75 percent of the perimeter of the interposer. Metallic via liners 141 and apertures 139 (FIG. 3) promote conduction of heat between each chip 122 and the plate 137 of the same subassembly. Further, heat is readily conducted from each chip 122 to the plate 137 of the next higher subassembly, through the conductive layer 180 disposed between such chip and plate. In operation, here again, the chips tends to evolve heat, but the heat is readily conducted to the shell and from the shell to the outside environment. Once again, the flexible inner ends of the leads and the compliant layers 152 and 180 permit free movement of the chips and interposers relative to one another and thus allow thermal expansion and contraction of the components to occur without substantial mechanical stresses in the system.

Numerous variations and combinations of the features discussed above can be utilized without departing from the present invention. For example, the relatively thick plates 137 and lead ends 147 may be formed by a subtractive process rather than by an additive process. In such a subtractive process, the dielectric layer is provided with a thick metallic layer equal to the finished thickness of the plates and lead ends and the thick metallic layer is etched to form the separate lead ends and the plates. Also, the leads may be positioned on one surface of the dielectric layer whereas the plates and tabs may be positioned on the opposite surface. In the arrangements discussed above, each chip has contacts arranged in two rows adjacent to two edges of the chip and the leads extend to two peripheral portions of the interposer. However, the number of rows of contacts on a chip; the number of edges on a chip contacts; and the number of peripheral portions on the interposer having leads all may be varied. For example, a rectangular interposer may have peripheral portions protruding outwardly from all four edges of the chip and may have leads extending to all four peripheral portions. Also, each plate may be provided with numerous tabs interspersed between lead ends and projecting outwardly on all of the peripheral portions of the interposer. Further, the plate need not cover the entire central region of the interposer; it can be provided as two entirely separate tabs each extending inwardly toward the chip from opposite edges of the interposer.

In those embodiments which utilize spherical, ball-shaped metal masses, such as the balls 54 depicted in FIG. 2, the diameter of each such ball is at least equal to the combine& thickness of the chip and compliant layer. Therefore, thinner chips and thinner compliant layers permit the use of smaller-diameter balls, which in turn allows the balls to and the outer ends of the leads to be more closely spaced on the surface of each interposer. Semiconductor chips most commonly are about 500 microns thick. Thinner chips, about 300 microns thick or less, and most preferably about 200 microns thick or less, are preferred. These chips typically are made by a "back grinding" operation, wherein the back surface of a chip or wafer is ground after the wafer has been processed to form the electronic components in the chips. Alternatively or additionally, the metal masses may have shapes other than spherical. Thus, thin, columnar masses with horizontal dimensions smaller than their vertical dimensions can be used to provide closer spacing of the vertical conductors.

The bonding materials used to secure the metal masses to one another and form the vertical conductors can include bonding materials other than solder. For example, a flowable conductive polymeric composition such as a metal-filled epoxy may be employed. Also, eutectic bonding or diffusion-bonding alloys may be used. Further, the vertical conductors can be formed by processes other than the stacking process discussed above. For example, each interposer can be formed with holes or notches at the outer ends of the leads. After the interposers are stacked, rods can be inserted through such holes or notches and bonded to the outer ends of the leads by reflowing solder on the rods or on the lead outer ends. In this arrangement, the rods form the vertical conductors.

In the assembly process, the process of making individual subassemblies of chips and interposers can be separate from the process of stacking the subassemblies. Thus, the individual subassemblies can be stocked, shipped and traded as separate articles of commerce, and can be stacked and bonded together by the purchaser. Also, although the assemblies discussed above incorporate both the stack of subassemblies and the circuit panel, the stacked subassemblies can be bonded together in the manner discussed above to form a semifinished assembly including the chips, interposers and vertical conductors. The semifinished assembly may also be stocked and traded as separate article of commerce, and may be connected to a circuit panel by the purchaser. In a preferred version of this arrangement, the semifinished assembly includes the encapsulant and, most preferably, also includes the metallic shell or enclosure surrounding the chips, interposers and vertical conductors. The semifinished assembly has the ends of the vertical conductors exposed at one face, and can be attached to a circuit panel by surface mounting techniques.

In a further variant, more than one chip can be provided on each level of the assembly. Thus, each interposer may be arranged to mount two chips side-by-side. When the interposers and chips are stacked atop one another, they form two stacks of chips side by side. The peripheral regions of each interposer projecting from the chip stacks may include a middle region disposed between the two stacks. The leads from both chips may extend to a such middle region, and the vertical conductors of the assembly may extend through the superposed middle regions. In this arrangement, the plates may extend beyond the chip stacks at sides of the stack remote from the middle region.

As these and other variations and combinations of the features described above can be utilized without departing from the present invention, the foregoing description of the preferred embodiment should be taken by way of illustration rather than by limitation of the invention as defined by the claims.

What is claimed is:

1. A multiple semiconductor chip assembly comprising a plurality of chip and interposer subassemblies, each said subassembly including an interposer and a semiconductor chip having faces, the chip being mounted to the interposer with one face of the chip facing the interposer, each said interposer including at least one peripheral portion projecting beyond the chip mounted to such interposer and a plurality of leads electrically connected to the chip and extending to said at least one peripheral portion, each said subassembly further including a compliant layer disposed between the chip and interposer of said subassembly so as to permit relative movement of the chip and interposer to compensate for thermal expansion thereof, said subassemblies being stacked one atop the other so that said chips overlie one another and said projecting portions of said interposers overlie one another, the assembly further comprising a plurality of vertical conductors extending alongside the chips and interconnecting the leads at said peripheral portions of said interposers.

2. An assembly as claimed in claim 1 wherein said vertical conductors form interconnections between leads of different interposers.

3. An assembly as claimed in claim 1 wherein said vertical conductors include metallic masses disposed alongside said chips and interconnecting leads of adjacent interposers.

4. An assembly as claimed in claim 3 wherein said metallic masses include metallic cores and metallic bonding material overlying said cores.

5. An assembly as claimed in claim 4 wherein said cores are formed from a metal selected from the group consisting of copper and copper-based alloys.

6. An assembly as claimed in claim 1 wherein said vertical conductors include metallic rods extending through a plurality of said interposers.

7. An assembly as claimed in claim 1 wherein each said interposer includes a dielectric layer.

8. An assembly as claimed in claim 7 wherein the leads of each said interposer extend along a surface of the dielectric layer of the interposer.

9. An assembly as claimed in claim 1 wherein each said lead includes a flexible inner end bonded to the chip having a first cross-sectional area and an outer end having a second cross-sectional area larger than said inner end.

10. An assembly as claimed in claim 9 wherein the outer end of each said lead is at least 25 microns thick.

11. An assembly as claimed in claim 1 wherein each said interposer has a central region aligned with the chip mounted to such interposer, and wherein each said interposer includes a metallic plate extending from said central region to a peripheral portion of such interposer.

12. An assembly as claimed in claim 11 wherein each said interposer has a plurality of peripheral portions extending outwardly at a plurality of edges of each such interposer, and wherein the leads of each said interposer and the plate of each such interposer extend to different peripheral portions of the interposer at different edges thereof.

13. An assembly as claimed in claim 11, and wherein said leads extend to peripheral portions of the interposers on oppositely-directed first and second edges thereof, each said plate extending to peripheral portions of the interposer at third and fourth edges thereof.

14. An assembly as claimed in claim 11 wherein each said interposer includes a dielectric layer having first and second sides, each said chip being disposed on the first side of the dielectric layer in the associated interposer, each said plate being disposed on the second side of the dielectric layer in the associated interposer, each said dielectric layer associated with a plate having apertures in the central region of the interposer, the assembly further comprising metallic posts extending from each said plate through the apertures in the associated dielectric layer to the first side of such layer for conduction of heat to such plate.

15. An assembly as claimed in claim 11 wherein each said interposer includes a dielectric layer, the leads of such interposer being disposed on one side of the dielectric layer, the plate of each interposer being disposed on the same side of the dielectric layer as the leads of such interposer.

16. An assembly as claimed in claim 11 wherein each said interposer includes a dielectric layer, the leads of such interposer being disposed on one side of the dielectric layer, the plate of each such interposer being disposed on the opposite side of the dielectric layer from the leads of such interposer.

17. An assembly as claimed in claim 1 further comprising a panel having conductors thereon defining an electrical circuit, said panel overlying said stack of subassemblies, said vertical conductors extending to said panel.

18. An assembly as claimed in claim 1 further comprising a metallic heat spreader juxtaposed with said stack.

19. An assembly as claimed in claim 18 wherein said spreader includes a metallic shell at least partially surrounding said stack.

20. An assembly as claimed in claim 19 further comprising a dielectric, heat conductive encapsulant substantially filling spaces within said shell around said stack.

21. A multiple semiconductor chip assembly comprising a plurality of semiconductor chips stacked one atop the other so that said chips overlie one another, means for electrically interconnecting the stacked chips with one another and with an external circuit, said assembly further comprising thermally conductive metallic plates disposed between adjacent chips in the stack compliant layers disposed between said chips and said conductive plates so as to compensate for differential thermal expansion of said chips and said plates, the plates extending outwardly from between the stacked chips to or beyond the edges of the stacked chips.

22. An assembly as claimed in claim 21 further comprising a metallic heat conductive shell at least partially encompassing said stacked chips and said plates, said plates extending into proximity with said shell.

23. An assembly as claimed in claim 21 wherein at least some of said plates are electrically connected to at least some of said chips.

24. An assembly as claimed in claim 23 wherein said plates are connected to ground or power connections of said chips.

25. An assembly as claimed in claim 21 wherein said means for connecting includes a plurality of leads extending laterally outwardly from said stacked chips and a plurality of vertical conductors extending alongside the stacked chips and interconnecting said leads.

* * * * *

UNITED STATES PATENT AND TRADEMARK OFFICE
CERTIFICATE OF CORRECTION

PATENT NO. : 5,861,666

DATED : January 19, 1999

INVENTOR(S) : Bellaar

It is certified that error appears in the above-indentified patent and that said Letters Patent is hereby corrected as shown below:

Column 3, line 39, "provides" should read --provide--.

Column 7, line 50, "fuse" should read --fusing--.

Column 8, line 67, "combine&" should read --combined--.

Column 9, line 41, "article" should read --articles--.

Column 10, line 58, delete "and".

Column 12, line 8, "stack compliant" should read --stack, compliant--.

Signed and Sealed this

Nineteenth Day of October, 1999

Attest:

Q. TODD DICKINSON

*Attesting Officer*  *Acting Commissioner of Patents and Trademarks*

(12) EX PARTE REEXAMINATION CERTIFICATE (6899th)
United States Patent
Bellaar

(10) Number: US 5,861,666 C1
(45) Certificate Issued: *Jun. 30, 2009

(54) STACKED CHIP ASSEMBLY

(75) Inventor: Pieter H. Bellaar, Baambrugge (NL)

(73) Assignee: Tessera, Inc., San Jose, CA (US)

Reexamination Request:
No. 90/008,654, May 21, 2007

Reexamination Certificate for:
Patent No.: 5,861,666
Issued: Jan. 19, 1999
Appl. No.: 08/705,309
Filed: Aug. 29, 1996

(*) Notice: This patent is subject to a terminal disclaimer.

Certificate of Correction issued Oct. 19, 1999.

Related U.S. Application Data

(60) Provisional application No. 60/003,035, filed on Aug. 30, 1995.

(51) Int. Cl.
*H01L 23/02* (2006.01)
*H01L 23/48* (2006.01)
*H01L 23/34* (2006.01)

(52) U.S. Cl. .................. 257/686; 257/723; 257/777; 257/779; 257/785; 257/E23.067; 257/E25.013

(58) Field of Classification Search .............. 257/686
See application file for complete search history.

(56) References Cited

U.S. PATENT DOCUMENTS

| | | | | |
|---|---|---|---|---|
| 3,648,131 A | 3/1972 | Stuby | ............ | 257/622 |
| 4,074,342 A | 2/1978 | Honn et al. | ............ | 361/779 |
| 4,190,855 A | 2/1980 | Inoue et al. | | |
| 4,413,308 A | 11/1983 | Brown | | |
| 4,601,526 A | 7/1986 | White et al. | ............ | 439/66 |
| 4,658,332 A | 4/1987 | Baker et al. | ............ | 361/751 |
| 4,667,219 A | 5/1987 | Lee et al. | ............ | 257/693 |
| 4,685,998 A | 8/1987 | Quinn et al. | ............ | 438/123 |
| 4,691,225 A | 9/1987 | Murakami et al. | | |
| 4,700,276 A | 10/1987 | Freyman et al. | ............ | 361/771 |
| 4,812,897 A | 3/1989 | Narita et al. | | |
| 4,822,550 A | 4/1989 | Komathu et al. | | |
| 4,866,841 A | 9/1989 | Hubbard | ............ | 29/845 |
| 4,887,148 A | 12/1989 | Mu | ............ | 257/664 |
| 4,903,118 A | 2/1990 | Iwade et al. | | |
| 4,932,883 A | 6/1990 | Hsia et al. | | |
| 4,939,316 A | 7/1990 | Mahulikar et al. | ............ | 174/546 |
| 4,954,875 A | 9/1990 | Clements | ............ | 257/686 |
| 4,954,878 A | 9/1990 | Fox et al. | | |
| 4,975,765 A | 12/1990 | Ackermann et al. | ............ | 257/737 |
| 4,996,583 A | 2/1991 | Hatada et al. | | |
| 4,996,587 A | 2/1991 | Hinrichsmeyer et al. | | |
| 5,006,673 A | 4/1991 | Freyman et al. | ............ | 174/255 |
| 5,014,161 A | 5/1991 | Lee et al. | | |
| 5,028,986 A | 7/1991 | Sugano et al. | ............ | 257/668 |
| 5,077,633 A | 12/1991 | Freyman et al. | | |
| 5,086,558 A | 2/1992 | Grube et al. | | |
| 5,099,309 A | 3/1992 | Kryzaniwsky | ............ | 361/718 |
| 5,153,385 A | 10/1992 | Juskey et al. | | |
| 5,166,772 A | 11/1992 | Soldner et al. | | |
| 5,216,278 A | 6/1993 | Lin et al. | | |
| 5,218,759 A | 6/1993 | Juskey et al. | | |
| 5,241,133 A | 8/1993 | Mullen, III et al. | ............ | 174/534 |

(Continued)

FOREIGN PATENT DOCUMENTS

EP 64854 11/1982

(Continued)

OTHER PUBLICATIONS

F. N. Sinnadurai, Handbook of Microlelctronics, Packaging and Interconnection Technologies, Electrochemical Publications Limited, 1985 edition, pp. 224–225.*

(Continued)

*Primary Examiner*—Pia Tibbits

(57) ABSTRACT

An assembly of semiconductor chips has the chips vertically stacked above one another. Interposers extending between adjacent chips have compliant layers to accommodate thermal expansion of the chips. Desirably, the interposers have metallic plates to conduct heat from the interior of the stack.

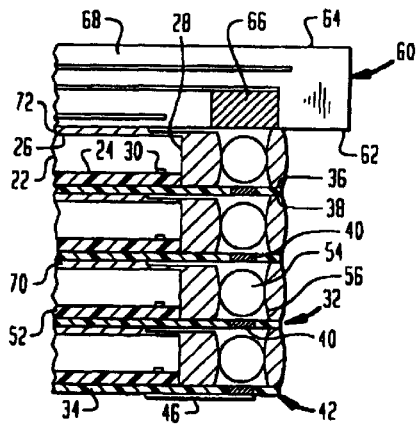

U.S. PATENT DOCUMENTS

| | | | | |
|---|---|---|---|---|
| 5,579,207 | A | 11/1996 | Hayden et al. | 361/790 |
| 5,583,375 | A | 12/1996 | Tsubosaki | 257/692 |
| 5,594,275 | A | 1/1997 | Kwon | 257/686 |
| 5,701,031 | A | 12/1997 | Oguchi et al. | 257/686 |
| 5,715,144 | A | 2/1998 | Ameen et al. | 361/790 |

FOREIGN PATENT DOCUMENTS

| | | |
|---|---|---|
| EP | 245179 | 11/1987 |
| JP | 56137659 | 10/1981 |
| JP | 5779652 | 5/1982 |
| JP | 58-218130 | 12/1983 |
| JP | 5996759 | 6/1984 |
| JP | 59172758 | 9/1984 |
| JP | 6097629 | 5/1985 |
| JP | 60194548 | 10/1985 |
| JP | S59-194460 | 11/1985 |
| JP | 61073341 | 4/1986 |
| JP | 61101067 | 5/1986 |
| JP | 61104630 | 5/1986 |
| JP | 61113252 | 5/1986 |
| JP | 61137335 | 6/1986 |
| JP | 61-177759 | 8/1986 |
| JP | 62008534 | 1/1987 |
| JP | 62210631 | 9/1987 |
| JP | 62232133 | 10/1987 |
| JP | 62277753 | 12/1987 |
| JP | 63070532 | 3/1988 |
| JP | 63104343 | 5/1988 |
| JP | 63204635 | 8/1988 |
| JP | 63258048 | 10/1988 |
| JP | 64028856 | 1/1989 |
| JP | 64046964 | 2/1989 |
| JP | 64081330 | 3/1989 |
| JP | 1108756 | 4/1989 |
| JP | 1-118456 | 8/1989 |
| JP | 1293556 | 11/1989 |
| JP | 1309362 | 12/1989 |
| JP | 21962 | 1/1990 |
| JP | 217655 | 2/1990 |
| JP | 2059399 | 2/1990 |
| JP | 260793 | 3/1990 |

OTHER PUBLICATIONS http://physics.uwstout.edu/statstr/Strength/Stress/strs38.htm.* http://physics.uwstout.edu/statstr/Strength/Stress/strs381.htm.*

Bolger, J. et al., "Die Attach in Hi–Rel P–Dips: Polymides or Low Chloride Epoxies?," Electronic Components Conference 34th, May 14–16, 1984, pp. 63–67.

Doany, "Method of Testing Chips and Joining Chips to Substrates," 2244 Research Disclosure, Feb. 1991, Elmsworth, GB, 32290; IBM Technical Disclosure Bulletin.

Ellis, "Improved C4 Reliability Using Low Modulus Dielectric Layer", IBM Technical Disclosure Bulletin, vol. 32, No. 6A, Nov. 1989, pp. 315–316.

Freyman, B. et al., "Overmolded Plastic Pad Array Carriers (OMPAC): A Low Cost, High Interconnect Density IC Packaging Solution for Consumer and Industrial Electronics," Proceedings of the 41st IEEE Electronic Components & Technology Conference, May 1991, pp. 176–182.

Gray, F., "Substrates for Chip Carrier Interconnections," Surface Mount Technology, The Int'l Society for Hybrid Microelectronics, pp. 59–85, 1984.

Hatada, K. et al., "Vertically Interconnected T–BTAB Devices For High Density Modules," IEPS, pp. 645–650, Sep. 10, 1990.

Hinrichsmeyer et al., "Solder–Filled Elastomeric Spacer," IBM Technical Disclosure Bulletin, Jan. 1985, vol. 27, No. 8, p. 4855.

Hoopman, T. et al., "New Film–Type Die Attach Adhesives," IEEE 0569–5503/88/0000–0473, pp. 473–479, 1988.

Lea, C., "A Scientific Guide to Surface Mount Technology," Chapter 3 (1988).

Lutz, M. et al., "Flexible Silicone Adhesive With High Electrical Conductivity," IEEE, 99, pp. 83–87.

Markstein, H., "Surface–Mount Substrates: The Key in Going Leadless," Electronic Packaging & Production, pp. 50–55, Jun. 1983.

Miura, H. et al., "Structural Effect of IC Plastic Package on Residual Stress in Silicon Chips," IEEE, pp. 316–321, May 1990.

Otsuka, et al., "High Reliability Mechanism of New Silicone Gel Sealing in Accelerated Environment Test," Int'l Electronics Packaging Society, Inc., pp. 720–726, Copyright 1986.

Pendse, R. et al., "Parametric Shifts in Devices: Role of Packaging Variables and Some Novel Solutions," ECTC 1990, pp. 322–326.

Pound, R., "Packaging Links Fast GaAs Dice to High–Speed Systems," Electronic Packaging & Production, Article Reprint 7, Aug. 1985.

Shoraka, F. et al., "Finite Element Analysis Of Compliant Coating," IEEE 0569–5503/88/0000–0461, 1988.

Suhir, E., "Die Attachment Design and Its Influence on Thermal Stresses in the Die and the Attachment," 1987 Proceedings 37th Electronic Components Conference, May 11–13, 1987, pp. 508–517.

Sduhir, E., AT&T Bell Laboratories, "Calculated Thermally Induced Stresses in Adhesively Bonded and Soldered Assemblies," Proceedings of the 1986 Int'l. Symposium on Microelectronics, Oct. 6, 1986, pp. 383–392.

Suzuki, K. et al., "Development of Low Elastic Modules Die Attach Material and Clean Cure Process," ECTC 1990, pp. 835–839.

Vaccaro, J., "Stress Management Via Low Modulus Urethane Adhesives For Electronic Applications," Hybrid Circuit Technology, Oct. 1990.

Ward, W., "Volume Production Of Unique Plastic Surface–Mount Modules For The IBM 80–ns 1–Mbit DRAM Chip By Area Wire Bond Techniques," IEEE 0569–5503/88/0000–0552, 1988.

* cited by examiner

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 7 and 8 are cancelled.

Claims 2 and 3 are determined to be patentable as amended.

Claims 4 and 5, dependent on an amended claim, are determined to be patentable.

New claims 26–33 are added and determined to be patentable.

Claims 6 and 9–25 were not reexamined.

2. An assembly as claimed in claim [1] *30 or 31*, wherein said vertical conductors form interconnections between leads of different interposers.

3. An assembly as claimed in claim [1] *30 or 31*, wherein said vertical conductors include metallic masses disposed alongside said chips and interconnecting leads of adjacent interposers.

*26. An assembly as claimed in claim 3, wherein said metallic masses include solder.*

*27. An assembly as claimed in claim 3, wherein said vertical conductors include a flowable conductive polymeric composition.*

*28. An assembly as claimed in claim 27, wherein said flowable conductive polymeric composition includes a metal-filled epoxy.*

*29. An assembly as claimed in claim 4, wherein said metallic bonding material includes solder.*

*30. An assembly as claimed in claim 8, wherein the dielectric layer of each said subassembly has an inner surface adjacent to the chip of the subassembly and an outer surface remote from the chip and the leads of the interposer therein extend along the outer surface of the dielectric layer therein.*

*31. An assembly as claimed in claim 7, wherein, in each subassembly a plurality of contacts are disposed on a front face of the chip to which the leads are electrically connected and the front face of the chip faces the dielectric layer.*

*32. An assembly as claimed in claim 30 or 31, wherein the compliant layer of each subassembly has a thickness of at least about 40 microns (μm) in a direction extending from the chip towards the dielectric layer of the same subassembly.*

*33. An assembly as claimed in claim 32, wherein the compliant layer has a thickness greater than 50 microns (μm).*

* * * * *